United States Patent
Ibnabdeljalil et al.

(10) Patent No.: US 6,365,978 B1
(45) Date of Patent: Apr. 2, 2002

(54) ELECTRICAL REDUNDANCY FOR IMPROVED MECHANICAL RELIABILITY IN BALL GRID ARRAY PACKAGES

(75) Inventors: M'hamed Ibnabdeljalil, Dallas, TX (US); S. Leigh Phoenix, Ithaca, NY (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/287,203

(22) Filed: Apr. 2, 1999

(51) Int. Cl.[7] .................. H01L 23/48; H01L 23/52; H01L 29/40
(52) U.S. Cl. .............. 257/786; 257/737; 257/778; 257/693
(58) Field of Search ................ 257/786, 780, 257/737, 778, 678, 693, 787; 438/613, 612, 666

(56) References Cited

U.S. PATENT DOCUMENTS

| | | | |
|---|---|---|---|
| 3,871,015 A | * 3/1975 | Lin et al. | 257/778 |
| 4,426,773 A | * 1/1984 | Hargis | 28/823 |
| 5,266,833 A | * 11/1993 | Capps | 257/723 |
| 5,450,283 A | * 9/1995 | Lin et al. | 361/704 |
| 5,612,575 A | * 3/1997 | De Givry | 257/786 |
| RE36,773 E | * 7/2000 | Nomi et al. | 257/787 |

FOREIGN PATENT DOCUMENTS

| | | | |
|---|---|---|---|
| JP | 61-19136 | * | 1/1986 |
| JP | 4-83343 | * | 3/1992 |
| JP | 4-162649 | * | 6/1992 |
| JP | 6-29296 | * | 2/1994 |

* cited by examiner

*Primary Examiner*—Jhihan B Clark
(74) *Attorney, Agent, or Firm*—Gary C. Honeycutt; Fred Telecky; Arthur I. Navarro

(57) ABSTRACT

A packaged semiconductor device with electrical redundancy for improved mechanical reliability and a method for fabrication are disclosed. The device comprises a semiconductor chip having an integrated circuit, said circuit having a multitude of electrical terminals with metal contact pads; an interposer of electrically insulating material having electrically conductive paths extending through said interposer from one surface to the opposite surface forming electrical entry and exit ports on said insulating interposer; said interposer with its entry and exit ports having regions of different mechanical stress levels; each of said chip contact pads being electrically connected to a respective entry port of said interposer and by means of said conductive paths to at least one respective exit ports; and at least one of said entry ports being electrically connected to a plurality of high-stress exit ports in parallel.

10 Claims, 3 Drawing Sheets n LINKS
STRENGTH OF CHAIN $Q_n = \min\{X_1, X_2, X_3, \cdots X_n\}$ n MEMBERS
STRENGTH OF BUNDLE $Q_n = \max\{X_1, \frac{n-1}{n}X_2, \cdots \frac{2}{n}X_{n-1}, \frac{1}{n}X_n\}$

ELECTRICAL REDUNDANCY FOR IMPROVED MECHANICAL RELIABILITY IN BALL GRID ARRAY PACKAGES

The present invention relates in general to the field of integrated circuit packages and more specifically to substantially flat integrated circuit packages having high solder joint stress reliability.

BACKGROUND OF THE INVENTION

Semiconductor integrated circuit chips have to be assembled in order to enable them to interact electrically with the outside world. For this reason, chips are mechanically positioned on supports and electrically connected for power, ground and signal lines. For stable mechanical positioning, chips are commonly attached (for example by glueing or soldering) to metallic, glassy or polymer substrates. For permanent electrical connection, chips are bonded by whisker wires or solder balls to conductors leading to outside electrical circuitry. In order to protect the sensitive whisker wires mechanically and to shield the chip against environmental disturbances, the assembled chip is commonly encapsulated in polymer or molding material, or housed in a ceramic package.

As a result, these semiconductor assemblies contain materials with different coefficients of thermal expansion (CTE); they are often coupled mechanically intimately, even rigidly to each other. Expressing CTE in ppm/° C., silicon has approximately 2.3, various metals from 4.3 to 17.0, and various plastics from 16.0 to 25.0. Consequently, whenever these assemblies undergo temperature excursions, the swings of increasing and decreasing temperatures induce different expansions and contractions in the materials coupled to each other, causing tensile and compressive stresses to build up in the component parts. If the package were a uniform laminate structure, the stresses in each individual layer could be analytically modeled. However, the package is not a uniform laminate, and the variations from the inuform laminate case create stress concentrations. Further, the package is assembled through a series of thermal process steps which build in stresses between various layers. Finite element analysis and measurements by test structures have proven useful in quantifying these stresses.

For plastic encapsulated silicon chips, adhered to metallic leadframes by polymer adhesives, these stresses were first analyzed in 1984 (Ref. 1: "Computer-aided Stress Modeling for Optimizing Plastic Package Reliability", by S. Groothuis, W. Schroen and M. Murtuza, 23rd Ann. Proc. Int. Reliab. Phys. Symp, pp. 184–191, 1985; Ref. 2: "Plastic Packaging" by W. Schroen, IRPS Tutorials 1985, pp. 4.1–4.18) and showed that shear stresses exhibit steep maxima when they are measured from the center of the chip towards the corners. Taken from Ref. 2, FIG. 1 shows the shear stress immediately above the chip, with the shear stress parallel to the surface of the chip reaching an intense maximum at each corner and approaching zero at the chip center. Quantitative strain values were obtained using diffused strain gauges integral with the silicon chip. With the additional effect of compressive stress in thermal cycling (for example, from −65 to +150° C.), the chip undergoes a pillow-shaped distortion.

Frequently, these strain and stress maxima were seen to cause severe reliability failures of the devices investigated. For instance, cracks in plastic materials close to the chip corners (especially adhesives and molding material) were observed; passivation layers over the silicon developed cracks; metallization lines in the corners of the integrated circuit shifted; gold wires ball-bonded close to the corners were ripped out of their chip bonding pads.

In the following years, those original observations have been confirmed numerous times and for many different semiconductor packages (for instance Ref. 3: "VLSI Packaging Thermomechanical Stresses" by D. Edwards, S. Groothuis, and M. Murtuza, IRPS Tutorials 1988, pp. 8.1–8.39). For devices encapsulated in the conventional dual-in-line and quad-flat packages, the industry has learned in the late 1980's and early 1990's, to mitigate or bypass many of these stress effects through careful circuit layout rules and proper choice of the materials. However, with the recent emergence of plastic ball-grid array packages, serious reliability risks from stress effects reappeared. Recently, measurements on semiconductor packages of the ball-grid array (BGA) type and chips-size (CSP) type found that the solder joints located close to the package corners (and close to the chip corners for flip-chip devices) are under particularly heavy strain. Using the universal relationship by Coffin and Manson, which relates the number of temperature cycles leading to failure of the solder joint with the strain induced per cycle, reasearchers were able to predict the number of temperature cycles needed to initiate failure. Using this analytical equation and empirical and geometric constants for the solder material employed, the lifetime in temperature cycling (for example, from 0° C. to +100° C.) could be predicted. It turned out to be shortest (for example, less than 2000) for the solder joints close to the package and chip corners.

A number of approaches have been proposed to mitigate the level of internal mechanical stress. For example, Christie et al. (U.S. Pat. No. 5,250,848 of Oct. 5, 1993) have disclosed the use of certain encapsulants to absorb part of the internal stress. Melton et al. (U.S. Pat. No. 5,233,504 of Aug. 3, 1993) and Okumura (U.S. Pat. No. 4,807,021 of Feb. 21, 1989) use balls made of materials of relatively high melting temperatures that have been coated with a layer of soft material. During package assembly, the balls do not melt so a collapse, due to weight, into a barrel shape with its significant built-in stress does not occur. After assembly, the soft outer layer acts as a buffer to absorb some of the built-in or subsequently generated stress. Blanton (U.S. Pat. No. 5,220,200 of Jun. 15, 1993) prevents the solder ball collapse with its highly stressed barrel shaped solder joints by providing pillers that support the ball gris array during melting. These pillera are made of a metal paste laid down by several paste screening processes. Ho (U.S. Pat. No. 5,598,036 of Jan. 28, 1997) uses two sets of solder joints that have different melting points. The joints with the higher melting point are positioned in the region, on the ball grid array, where it is known that stress will be a maximum in the finished package. The joints with lower melting solder occupy the remaining positions on the underside of the ball grid array.

While some of these proposals resulted in modest improvements, none of them attacked the essential failure mechanism, which is always the failure of the weakest joint. Consequently, a need has arisen for a more fundamental solution to the failure mechanism of the weakest link, as well as methods to fabricate devices using low-cost processes. The improved reliability should be achieved without jeopardizing the stringent requirements of low-profile ball-grid array and small-outline packages. Preferably, these improvements should be accomplished using the installed equipment base so that no investment in new manufacturing machines is needed.

SUMMARY OF THE INVENTION

The present invention comprises semiconductor ball-grid array packages, chip-size packages and flip-chip assemblies with improved mechanical reliability achieved by electrical redundancy of input/output terminals. The invention defines the design rules for the electrical redundancy and the methods for fabricating the chip inputs/outputs and the solder ball configuration of BGA packages.

The present invention applies certain results taken from mathematical probability and failure theory. In assessing the failure of the solder joints of an assembled flip-chip device, BGA package, or chip-size package, the two-dimensional array of solder joints is conceptually equivalent to a long "chain" of structurally and statistically independent members, arranged sequentially. Consequently, it is important to notice that the chain fails, when the weakest member fails.

In contrast to the failure mode of a chain is the failure mode of a "bundle" consisting of members arranged in parallel with no bonding or friction between the members. If one or even several of the members have failed, the bundle as a whole has not yet failed, but rather all non-failed members share the bundle strength. Consequently, the strength of the bundle is higher than the minimum strength of the individual members; how much higher, depends on the individual values with the rank position of the individual member within the bundle (it may even approach the value of the maximum individual member strength). It follows that by operating a bundle in parallel mode, its strength is significantly enhanced, the risk of total failure is much reduced, and thus the reliability is improved.

For the invention, the "bundle" consists of the number of solder joints operating in parallel to serve one terminal of the device (in the high-strain regions of the device). "Serving one terminal" is equivalent to "electrically redundant". According to the invention, when the reliability of a semiconductor device is expressed by the number of temperature cycles it can survive before failure, then this number of cycles increases dramatically with the number of electrically redundant solder joints in the high-strain regions of the device. In order to meet the reliability typically expected of semiconductor products inspite of the stresses observed in the high-strain regions in many BGA and CSP device types, the number of needed electrically redundant solder joints varies between 2 and 6.

It is an object of the present invention to leapfrog to the order-of-magnitude higher reliability of the next generation of semiconductor product in ball-grid array and chip-size packages by selective and optimized electrically redundant solder joints.

Another object of the present invention is to provide reliability assurance for the finished product by changing the failure mechanism from a probabilistic weakest-link mode to a parallel-type mode, effectively eliminating the failure mechanism.

Another object of the present invention is to provide a design method of electrical redundancy which are flexible so that they can be applied to several families of products, and are general, so that they can be applied to several future generations of products.

Another object of the present invention is to provide a low-cost process for fabrication and assembly.

Another object of the present invention is to minimize the cost of capital investment and to use the installed fabrication equipment base.

These objects have been achieved by the design of the chip and the package of the invention and a mass production process. Various modifications have been successfully employed for electrical redundancy of the packages and the assembly of individual packages and packages-on-board.

In one embodiment of the invention, the selection rules for electrical redundancy are described in relation to the chip terminals in the high-stress areas of the chip, creating contact pads in parallel and operated redundantly.

In another embodiment of the invention, solder balls are disposed on the chip contact pads and assemblies produced using flip-chip technology.

In a further embodiment of the invention, ball-grid array and chip-size packages are selected to determine the minimum number of redundancy needed to meet the required reliability criterion for the selected package.

In another embodiment of the invention, ball-grid array and chip-size packages, designed with parallel terminals, are used to operate few I/O solder balls in parallel to highlight that from a statistical point of view the parallel operation, like a fiber-reinforced composite, is more reliable than the chain-operated monolithic counterpart.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
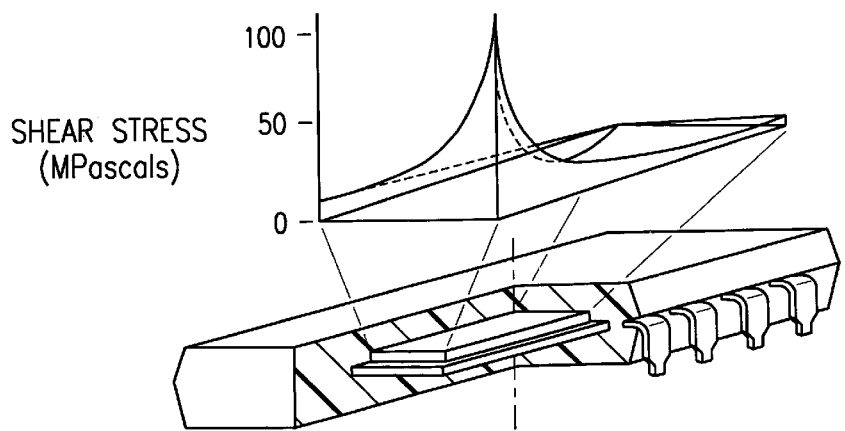
FIG. 1 shows literature data of the stress in a high-strain region of a chip quadrant of a packaged semiconductor device.
Figure 2:
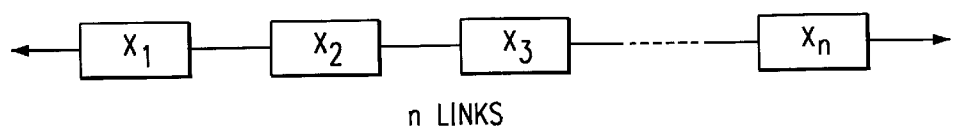
FIG. 2 depicts members arranged sequentially in a chain in order to show the observed strength and reliability of the chain.

When semiconductor devices, such as BGAs and CSPs, are mechanically and electrically connected, usually by soldering, to application wiring boards or to substrates made of plastic, ceramic, glass or composites, materials with different coefficients of thermal expansion are usually brought into close contact. Stresses induced by thermal process steps and the thermal excursions during device testing or operation may lead to material fatigue, delamination and cracks in zones of stress maxima. As FIG. 2 illustrates, a long chain of n structurally and statistically independent members with strengths X1, X2, X3, Xn fails, when the weakest member fails. Or, the chain survives if each member survives. In other words, the strength Qn of the chain is the minimum of the set X1, X2, X3, Xn, as indicated in FIG. 2.

Figure 3:
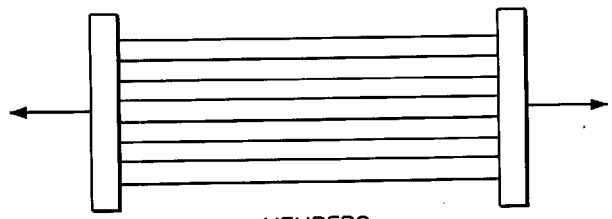
FIG. 3 depicts members arranged in parallel in a bundle in order to show the observed strength and reliability of the bundle.

Since the two-dimensional array of solder joints in BGAs and CSPs is conceptually equivalent to the long chain of FIG. 2, the invention uses in the regions of stress maxima a transition to the concept of the bundle depicted in FIG. 3. In continuous members of strength X1, X2, X3, Xn with no bonding or friction between the members, are coupled, with excellent clamping, into a bundle. If all members had the same strength X, the strength of the bundle would be nX. In this case, if i out of n members have failed, the stress on each survivor is nX/(n−i), and all non-failed members share the bundle strength equally. If the members have different strengths X1, X2, X3, Xn, as indicated in FIG. 3, the total strength of the bundle is give by the expression in FIG. 3. According to this expression, the strength Qn is higher than the minimum of the set X1, X2, X3, Xn. How much higher, depends on the individual values in the equation with the rank position of the individual member within the bundle.

For the solder ball attachment of BGAs and CSPs, which are the preferred embodiments of the present invention, the array of solder balls may be considered as being made of members of approximately equal strength. According to the invention, in the device regions of excessive stress several solder balls are combined into bundles of equal strength members, electrically operated in parallel mode. As a consequence, the probability of failure due to mechanical stress drops by several orders of magnitude.

Figure 4:
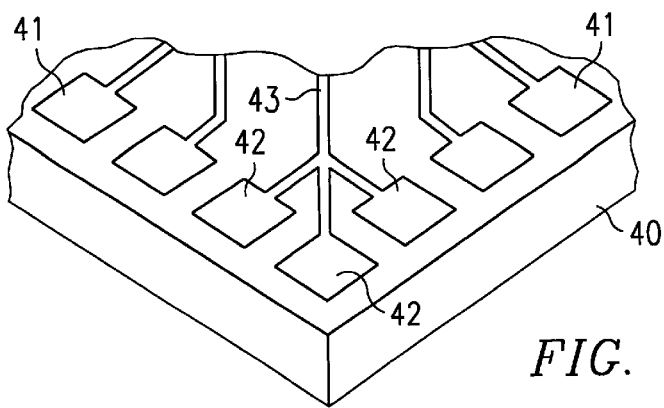
FIG. 4 is the perspective view of a corner of a semiconductor chip showing schematically the parallel design of contact pads.

FIG. 4 illustrates schematically the corner of a semiconductor chip 40. A plurality of contact pads 41 are aligned parallel and close to the edges of chip 40. The term "parallel" is used here in the conventional geometrical sense of being linearly aligned and at equal distance to a reference line for the whole length under consideration. Since the corner of a semiconductor chip is known to become region under high stress after assembly of the chip, FIG. 4 shows one embodiment of the invention to prevent any operational failure due to excessive stress. Three contact pads 42 are designed to be "parallel terminals" of interconnecting strip 43; the terminals will to be operated electrically in redundant manner. The term "parallel" is used in this context in a sense specific to the present invention, namely being "conceptually parallel", or "functionally parallel" like the members in the bundle of FIG. 3, and allowing redundant operation under use. In this context, the term "parallel" does not necessarily imply linear alignment or geometrical parallelism.

When chips 40 are made of silicon and are to be connected by gold or copper bonding wires, the contact pads 42 in FIG. 4, like contact pads 41, are typically made of aluminum, aluminum alloyed with a small percentage copper (usually 0.5 to 2%) and/or silicon (usually 1%), or copper; they exhibit thickness ranging approximately from 0.5 to 1 µm. Their size may vary from 70 to 150 µm squared. However, when chips 40 are to be connected by solder material, usually a lead-tin alloy, then contact pads 42, like contact pads 41, typically have additional layers of refractory metals (such as molybdenum, titanium, tungsten, or chromium) and noble metals (such as palladium, gold, or platinum), deposited over the underlying metal (aluminum or copper) of the contact pads.

Figure 5:
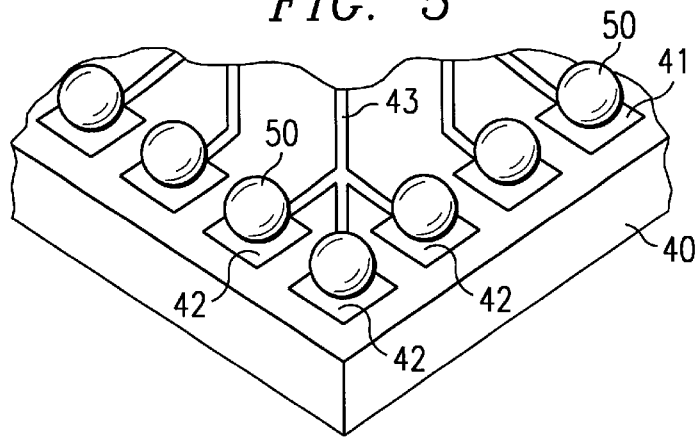
FIG. 5 is the perspective view of the chip corner of FIG. 4 after disposing solder balls, generating electrically redundant solder joints when assembled onto a wiring board.

An example of solder material disposed in the form of solder balls is shown in the embodiment of FIG. 5. Employing the same reference numbers for equivalent parts as in FIG. 4, contact pads 42 are designed as parallel terminals for interconnecting strip 43, with solder balls 50 disposed on contact pads 42. In uniform manner, solder balls are also disposed on contact pads 42. Solder balls 50 consist of lead-tin alloys of a composition selected by the desired melting point of the solder for the reflow professes intended for the device; the diameter of the balls before reflow is usually in the range from 0.1 to 0.5 mm.

In assembly, chip 40 of FIG. 5 is attached to a substrate or printed wiring board by reflowing solder balls 50. Commonly, these substrates are made of electrically insulating materials such as glass, plastic or composites. An example is the well-known epoxy resin FR-4, which typically has a thickness ranging from 0.3 to several mm; alternatively, polyimide-based boards are in use. When metal substrates, for instance copper, are employed, they usually have an electrically insulating surface layer. All of these materials have a CTE significantly larger than semiconductor chip 40, mostly silicon. The high temperature necessary for the attachment process, as well as any other elevated temperature encountered during testing and operation of the chip-on-board device, will induce stress into the solder joints, with severe maxima in the corner regions of the chip. Without the invention as embodied by FIG. 5, the highly stressed solder will fatigue and the weakest joint will eventually crack after a number of temperature cycles. In contrast, with the design of the contact pads in the high-stress corner regions of the chip according to the invention, as shown in FIG. 5, the electrical redundancy changes the failure behavior from the weakest link to a parallel type mode, increasing the reliability by several orders of magnitude.

Based on the desired reliability criterion of the device, the required redundancy can be mathematically optimized. In the embodiment of FIG. 5, the redundancy is three. In other examples according to the invention, it may be two, or four (see for instance FIG. 10), or more. The cost of supplying these few non-operational input/output solder balls is negligible, but the statistical gain for reliability is dramatic.

Figure 6:
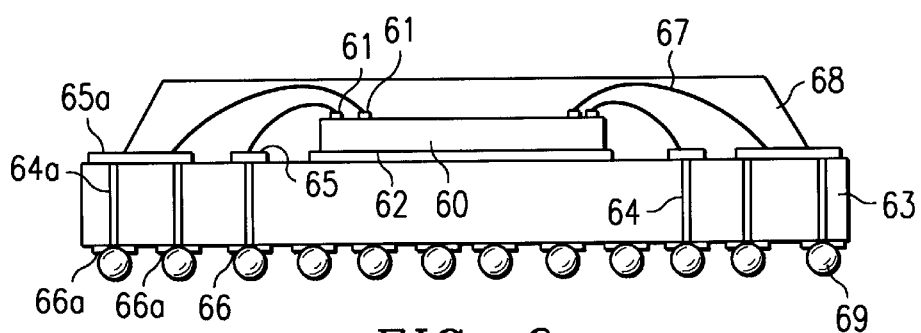
FIG. 6 is the simplified cross section of a ball-grid array package with wire-bonded semiconductor chip showing schematically the design of electrical redundancy.

As another embodiment of the present invention, FIG. 6 shows a schematic and simplified cross section through a BGA package. Semiconductor chip 60, having an integrated circuit with a multitude of electrical terminals with metal contact pads 61, is adhered by attachment layer 62 to an interposer 63 of electrically insulating material. Interposer 63 has a plurality of electrically conductive paths 64 extending through its insulating material from one surface to the opposite surface, forming electrical entry ports 65 and exit ports 66 on the interposer. Each contact pad 61 of semiconductor chip 60 is electrically connected to a respective entry port 65 of interposer 63 using conventional bonding wires 67. Since each entry port 65 is connected to a respective exit port 66 by means of a conductive path 64 traversing the interposer, each contact pad 61 is connected to an exit port 66. After all wires 67 have been bonded, they are protected by potting or molding material 68 up to a height of about 20 to 50 µm on top of the maximum wire loop height. At last, solder balls 69 are disposed on exit ports 66.

It is critically important to the present invention that some entry ports 65a are electrically connected by means of conductive paths 64a to more than one exit port 66a, organized in parallel for electrical redundancy. In the example of FIG. 6, the entry port 65a is enlarged so that is offers space for more than one conductive path 64a, each path ending in a separate exit port 66a. The same functional parallelism can be achieved by enlarging the exit port in order to acquire space for more than one solder ball. The goal is at any rate to achieve electrical redundancy by parallel assembled connections (solder balls) in those regions of the BGA which will undergo maximum strain and stress in device operation or testing after assembly, and are, therefore, at risk for solder joint failures. With the electrical redundancy accomplished by the invention, the risk of device failure is much reduced and the mechanical reliability, therefore, improved by orders of magnitude.

Attachment layer 62 may be a double-sided adhesive polyimide tape. Interposer 63 is made of an electrically insulating material such as the epoxy resin FR-4; it has typically a thickness of 0.3 mm. Alternatively, a polyimide-based interposer may be used. Interposers provide electrical connection between the wire-bonded semiconductor chip and an assembly board (P.C. board); in order to improve their flexibility and to help preventing solder ball cracking under mechanical stress due to thermal cycling, they may be made of compliant material such as tape or Kapton™ film, and may contain single or multiple layers of conductors. Interposers are commercially available, for instance Novaclad® and ViaGrid® from Sheldahl, Inc., Northfield, Minn. They are typically fabricated by laminating alternative films of electrically insulating and electrically conducting (such as copper) materials into one coherent layer. Connections through individual insulating films (for instance 64 and 64a in FIG. 6) are made by laser drilling and metal (such as copper) refilling or plating, and patterning of the conductive films is achieved by ablation or etching. Entry ports 65 and 65a, and exit ports 66 and 66a are also typically made of copper, often with a protective flash of gold. In order to enhance solderability of the exit ports 66 and 66a, an extra flash of palladium or platinum may be added.

The whisker wires 67 (usually gold, gold alloy, or copper, usually 0.8 to 1.3 $\mu$m diameter) are bonded after the semiconductor chip 60 has been adhered to the interposer 63. Known technology allows a pitch of gold balls between 70 and 100 $\mu$m. Moving the bonder capillary containing the gold wire in a pre-determined and computer-controlled manner through the air will create a wire looping of exactly defined shape. For instance, recent technical advances allow the formation of sequential paths of different looping heights. With this capability, wire loops of controlled height and no sagging for safely crossing to entry ports as far away as 7.5 mm can be manufactured.

Figure 7:
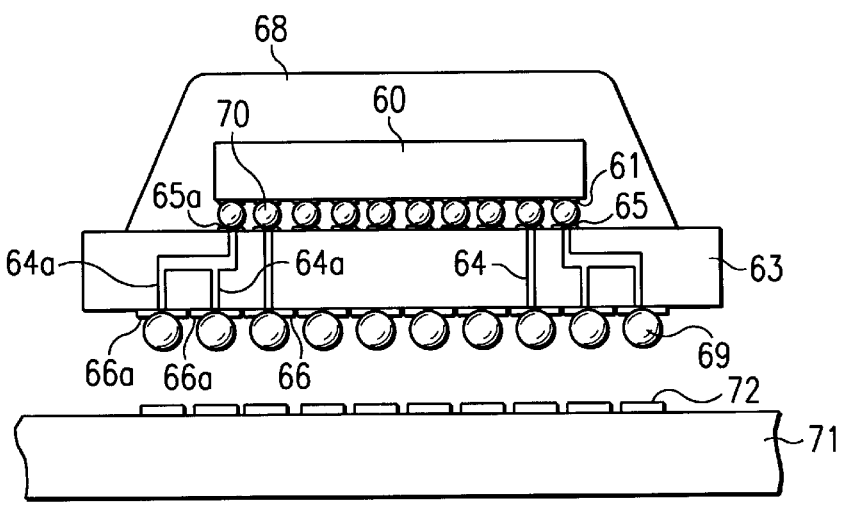
FIG. 7 is the simplified cross section of a ball-grid array package with flipped and solder ball assembled semiconductor chip showing schematically the design of electrical redundancy.

Another embodiment of the invention is illustrated in FIG. 7. The BGA of FIG. 7 is in many respects similar to the BGA of FIG. 6, but each contact pad 61 of semiconductor chip 60 is electrically connected to a respective entry port 65 of interposer 63 by solder balls 70. They may have a diameter similar to solder balls 69 (0.1 to 0.5 mm), but are often smaller. Solder balls 70 are typically lead-tin alloys and their mixture may be chosen to select a melting point equal or different from the melting point of solder balls 69. As can be seen in FIG. 7, each contact pad 61 of semiconductor chip 60 is electrically connected by one solder balls 70 to a respective entry port 65 of interposer 63. Interposer 63 has a plurality of electrically conductive paths 64 extending through its insulating material from one surface to the opposite surface, forming electrical entry ports 65 and exit ports 66 on the interposer. Since each entry port 65 is connected to a respective exit port 66 by means of a conductive path 64 traversing the interposer, each contact pad 61 is connected to an exit port 66. The application of potting or molding material 68 over the assembled chip 60 is optional since the solder balls 70 are much sturdier than the wire bonds in FIG. 6 so that a mechanical protection of the assembly is not a necessity. At last, solder balls 69 are disposed on exit ports 66.

It is essential to the present invention that some entry ports 65 in FIG. 7 are electrically connected by means of conductive paths 64a to more than one exit port 66a, organized in parallel for electrical redundancy. In the design of FIG. 7, the single entry port 65a is fanning by means of parallel conductive paths 64a to multiple yet separate exit ports 66a, each with its individual solder ball 69. The same functional parallelism can be achieved by enlarging the exit port in order to acquire space for more than one solder ball. The goal is at any rate to achieve electrical redundancy by parallel assembled connections (solder balls) in those regions of the BGA which are under maximum strain and stress in device operation or testing after assembly, and are, therefore, at risk for solder joint failures. The localized build-up of stress in solder joints, especially in the corner and edge regions of the semiconductor device, becomes obvious when the BGA of FIG. 7 is assembled on wiring board or substrate 71 by reflowing solder balls 69 onto solder pads 72. Substrate 71 is usually made of electrically insulating material, often compliant material, plastic, glass, or metal covered by an insulating layer. The significant differences of coefficients of thermal expansion between substrate 71 and the parts of the semiconductor device (especially the chip), coupled with the number and severity of the temperature cycles, determine the amount of stress in the solder joint and thus its life expectancy before material fatigue and mechanical failure. With the electrical redundancy accomplished by the invention, the risk of device failure is much reduced and the mechanical reliability, therefore, improved by orders of magnitude.

Figure 8:
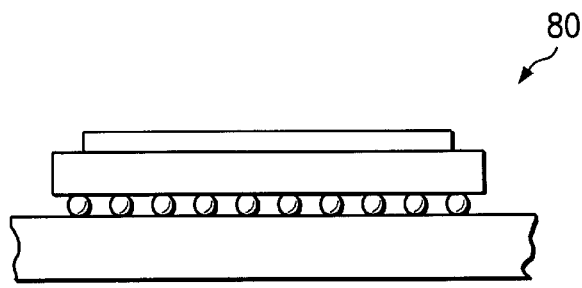
FIG. 8 is the simplified and schematic cross section through a chip-size package, assembled onto a board, with the details of the solder ball connections shown in FIGS. 9 and 10.
Figure 9:
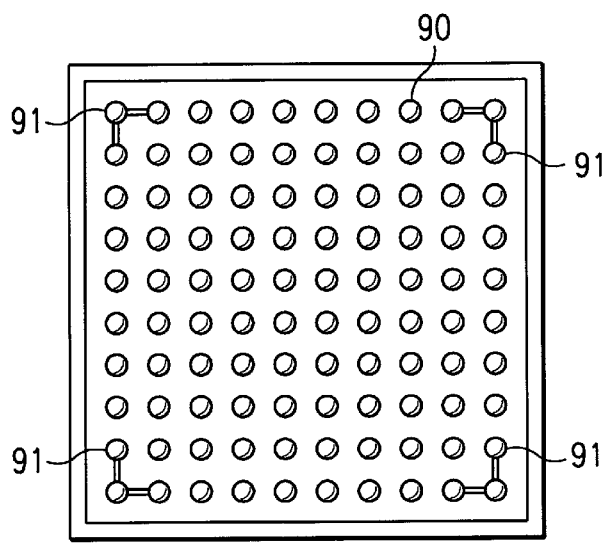
FIG. 9 is the schematic view of the solder ball array of the CSP in FIG. 8 showing one embodiment of solder ball arrangement for electrical redundancy.
Figure 10:
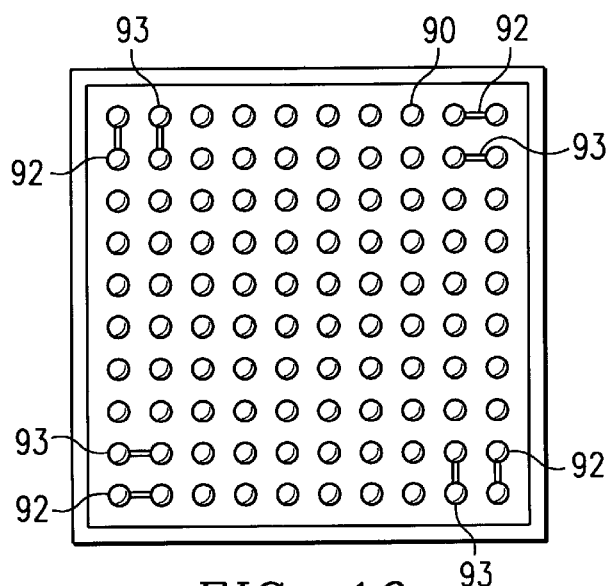
FIG. 10 is the schematic view of the solder ball array of the CSP in FIG. 8 showing another embodiment of solder ball arrangement for electrical redundancy.

Applying the desired reliability, or lack of failure, to probability theory, the required number of solder joints can be calculated which are needed to operate in parallel "as a bundle" and serve one device terminal in the high-stress regions of the device. "Serving one terminal" is another expression for "electrically redundant". For semiconductor devices such as the BGAs described in FIGS. 6 and 7, the number of solder joints in parallel varies between 2 and 6; most frequently, devices are dramatically improved by 3 joints in parallel. For a CSP such as generally designated 80 in the schematic cross section of FIG. 8, some embodiments are shown in FIGS. 9 and 10. Displayed are schematic views of the arrays of solder balls 90 of the CSP in FIG. 8. In the embodiment of FIG. 9, three solder balls 91 are arranged in parallel to be operated electrically redundant for one terminal. The groupings are located in the four corners of the device, which are known to exhibit maximum stress in device operation. In the embodiment of FIG. 10, two solder balls each, designated 92 for the one pair and 93 for the other pair, are arranged in parallel to be operated electrically redundant for two terminals. Again, both pairs 92 and 93 are located in the four corners of the device, which are known to exhibit maximum stress in device operation.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

It is, therefore, intended that the appended claims encompass any such modifications or embodiments.

What is claimed is:

1. A semiconductor unit comprising:

a semiconductor chip having a surface carrying an integrated circuit;

said integrated circuit having a multitude of electrical terminals with metal contact pads;

said contact pads being located in regions of different mechanical stress levels; and at least one of said terminals having a plurality of high-stress contact pads electrically in parallel.

2. The semiconductor unit according to claim 1 wherein said plurality of contact pads in parallel of said at least one terminal is located in an area of said unit under maximum mechanical stress.

3. The semiconductor unit according to claim 1 wherein solder balls are disposed on each of said contact pads.

4. The semiconductor unit according to claim 1 wherein said chip comprises silicon, gallium arsenide, or any other semiconductor material used in electronic device production.

5. The semiconductor unit according to claim 3 wherein said solder balls on each of said contact pads are used to attach said unit to an interconnecting substrate.

6. A semiconductor device comprising:

a semiconductor chip having an integrated circuit, said circuit having a multitude of electrical terminals with metal contact pads;

an interposer of electrically insulating material having electrically conductive paths extending through said interposer from one surface to the opposite surface forming electrical entry and exit ports on said insulating interposer;

said interposer with its entry and exit ports having regions of different mechanical stress levels;

each of said chip contact pads being electrically connected to a respective entry port of said interposer and by means of said conductive paths to at least one respective exit port; and at least one of said entry ports being electrically connected to a plurality of high-stress exit ports in parallel.

7. The semiconductor device according to claim 6 wherein said chip contact pads are electrically connected to said respective interposer entry ports by bonding wires.

8. The semiconductor device according to claim 6 wherein said chip contact pads are electrically connected to said respective interposer entry ports by solder balls.

9. The semiconductor device according to claim 6 wherein a plurality of solder balls is disposed on said exit ports of said interposer.

10. The semiconductor device according to claim 6 wherein said chip comprises silicon, gallium arsenide, or any other semiconductor material used in electronic device production.

* * * * *